(12) United States Patent
Han et al.

(10) Patent No.: US 8,976,584 B2
(45) Date of Patent: Mar. 10, 2015

(54) FLASH MEMORY DEVICE AND METHOD OF PROGRAMMING THE SAME

(71) Applicants: Jinman Han, Seongnam-Si (KR); Ho-Chul Lee, Seoul (KR); Min-Su Kim, Hwaseong-Si (KR); Sangwan Nam, Hwaseong-Si (KR); Junghoon Park, Hwaseong-Si (KR)

(72) Inventors: Jinman Han, Seongnam-Si (KR); Ho-Chul Lee, Seoul (KR); Min-Su Kim, Hwaseong-Si (KR); Sangwan Nam, Hwaseong-Si (KR); Junghoon Park, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 130 days.

(21) Appl. No.: 13/767,535

(22) Filed: Feb. 14, 2013

(65) Prior Publication Data

US 2013/0275658 A1  Oct. 17, 2013

(30) Foreign Application Priority Data

Apr. 17, 2012  (KR) .................. 10-2012-0039806

(51) Int. Cl.
| | | |
|---|---|---|
| *G11C 11/34* | (2006.01) | |
| *G06F 12/02* | (2006.01) | |
| *G11C 16/04* | (2006.01) | |
| *G11C 16/34* | (2006.01) | |
| *H01L 27/115* | (2006.01) | |

(52) U.S. Cl.
CPC ........ *G06F 12/0246* (2013.01); *G11C 16/0483* (2013.01); *G11C 16/3418* (2013.01); *H01L 27/11582* (2013.01)
USPC ............ 365/185.03; 365/185.11; 365/185.12; 365/185.17; 365/185.18; 365/185.24; 365/185.29; 365/185.33

(58) Field of Classification Search
USPC ............. 365/185.03, 185.11, 185.12, 185.17, 365/185.18, 185.24, 185.29, 185.33
See application file for complete search history.

(56) References Cited

U.S. PATENT DOCUMENTS

| | | | |
|---|---|---|---|
| 6,532,556 | B1 | 3/2003 | Wong et al. |
| 6,958,940 | B2 | 10/2005 | Takase et al. |
| 7,184,308 | B2 * | 2/2007 | Kwon et al. .............. 365/185.17 |
| 8,717,817 | B2 * | 5/2014 | Cho et al. ................. 365/185.17 |
| 2007/0118719 | A1 | 5/2007 | Ozeki et al. |
| 2009/0161426 | A1 | 6/2009 | Tu et al. |
| 2009/0316490 | A1 | 12/2009 | Takada |

(Continued)

FOREIGN PATENT DOCUMENTS

| | | |
|---|---|---|
| JP | 2007-141376 | 6/2007 |
| JP | 2008-198299 | 8/2008 |

(Continued)

*Primary Examiner* — Trong Phan
(74) *Attorney, Agent, or Firm* — Volentine & Whitt, PLLC

(57) ABSTRACT

A method is provided for programming a flash memory device including memory cells formed in a direction perpendicular to a substrate, a first sub word line connected to first memory cells and selectable by a first selection line, and a second sub word line connected to second memory cells and selectable by a second selection line, the first and second memory cells being formed at the same level and being supplied with a program voltage at the same time. The method includes performing LSB program operations on the first and second sub word lines by enabling the first and second selection lines, respectively; performing CSB program operations on the first and second sub word lines by enabling the first and second selection lines, respectively; and performing MSB program operations on the first and second sub word lines by enabling the first and second selection lines, respectively.

20 Claims, 19 Drawing Sheets

(56) References Cited

U.S. PATENT DOCUMENTS

2010/0259980 A1   10/2010   Futatsuyama
2010/0322000 A1   12/2010   Shim et al.

FOREIGN PATENT DOCUMENTS

| | | |
|---|---|---|
| JP | 2009-158082 | 7/2009 |
| KR | 1020100136785 A | 12/2010 |

* cited by examiner

FLASH MEMORY DEVICE AND METHOD OF PROGRAMMING THE SAME

CROSS-REFERENCE TO RELATED APPLICATIONS

A claim for priority under 35 U.S.C. §119 is made to Korean Patent Application No. 10-2012-0039806, filed Apr. 17, 2012, in the Korean Intellectual Property Office, the entire contents of which are hereby incorporated by reference.

BACKGROUND

The embodiments described herein relate to a semiconductor memory device, and more particularly, relate to a flash memory device having a three-dimensional structure and a method of programming the same.

Semiconductor memory devices include volatile memories, such as dynamic random access memory (DRAM), static random-access memory (SRAM), and the like, and nonvolatile memories, such as electrically erasable programmable read-only memory (EEPROM), ferroelectric random access memory (FRAM), phase-change random access memory (PRAM), magnetoresistive random access memory (MRAM), flash memory, and the like. A volatile memory loses stored data when powered off, while a nonvolatile memory retains stored data even after powering off. Advantages of flash memory devices include high programming speed, low power consumption, mass storage capacity, and the like. For this reason, flash memory devices are widely used as storage mediums for various computer systems.

The degree of integration of flash memory has generally increased to provide excellent performance and price competitiveness. However, conventional two-dimensional flash memory is limited in the extent to which the degree of integration may increase, e.g., due to the fabrication processes. Three-dimensional flash memory may be developed to overcome such limitations.

Although a three-dimensional structure generally increases the degree of integration, it may also reduce the data reliability, for example, due to the coupling caused by interference between cells or due to program disturbance caused during programming. In particular, when two or more bits of data are stored in one memory cell, the reliability of the data may be reduced.

SUMMARY

An illustrative embodiment provides a flash memory device including multiple memory cells formed in a direction perpendicular to a substrate, first and second sub word lines, and a program scheduler. The first sub word line is connected to first memory cells from among the multiple memory cells, the first sub word line being formed at a first level and selectable using a first selection line. The second sub word line is connected to second memory cells from among the multiple memory cells, the second sub word line being formed at the first level and selectable using a second selection line, where the second sub word line is supplied with a program voltage at the same time as the first sub word line. The program scheduler is configured to adjust a program sequence to perform lower bit data program operations on the first and second sub word lines and then to perform upper bit data program operations on the first and second sub word lines by enabling the first and second selection lines, respectively.

The flash memory device may further include a third sub word line connected to third memory cells from among the multiple memory cells, the third sub word line being formed at the first level and selectable using a third selection line, where the third sub word line is supplied with the program voltage at the same time as the first sub word line and the second sub word line. The program scheduler may be further configured to adjust the program sequence to perform lower bit data program operations on the first to third sub word lines and then to perform upper bit data program operations on the first to third sub word lines by enabling the first, second and third selection lines, respectively.

The program scheduler may be further configured to sequentially enable the first, second and third selection lines to successively perform the lower bit data program operations on each of the first to third sub word lines, and then to sequentially enable the first, second and third selection lines to successively perform the upper bit data program operations on each of the first to third sub word lines. The program sequence of performing the lower bit data and upper bit data program operations on each of the first to third sub word lines may be the same.

The flash memory device may further include a fourth sub word line connected to fourth memory cells from among the multiple memory cells, the fourth sub word line being formed at a second level, different from the first level, and selectable using the first selection line; and a fifth sub word line connected to fifth memory cells from among the multiple memory cells, the fifth sub word line being formed at the second level and selectable using the second selection line, where the fifth sub word line is supplied with the program voltage at the same time as the fourth sub word line. The program scheduler may be further configured to adjust the program sequence to perform lower bit data program operations on the fourth and fifth sub word lines and then to perform upper bit data program operations on the fourth and fifth sub word lines by enabling the fourth and fifth selection lines, respectively. The program scheduler may be further configured to perform the lower bit data and upper bit data program operations on the fourth and fifth sub word lines after performing the lower bit data and upper bit data program operations on the third sub word line. Also, the first and fourth sub word lines may be formed in a first plane of a block in the flash memory device, and the second and fifth sub word lines may be formed in a second plane of the block in the flash memory device.

Another illustrative embodiment provides a flash memory device including multiple memory cells formed in a direction perpendicular to a substrate, first, second and third sub word lines, and a program scheduler. The first sub word line is connected to first memory cells from among the multiple memory cells, the first sub word line being formed at a first level and selectable using a first selection line. The second sub word line is connected to second memory cells from among the multiple memory cells, the second sub word line being formed at the first level and selectable using a second selection line, where the second sub word line is supplied with a program voltage at the same time as the first sub word line. The third sub word line is connected to third memory cells from among the multiple memory cells, the third sub word line being formed at the first level and selectable using a third selection line, where the third sub word line is supplied with the program voltage at the same time as the first sub word line. The program scheduler is configured to adjust a program sequence to perform lower bit data program operations on the first to third sub word lines and then to perform upper bit program operations on the first to third sub word lines in a program sequence different from that of the lower bit program operations by enabling the first to third selection lines, respectively.

Another illustrative embodiment provides a flash memory device including multiple memory cells formed in a direction perpendicular to a substrate, multiple sub word lines, and a program scheduler. The multiple sub word lines are formed at the same level of the flash memory device and are selectable using corresponding selection lines, respectively, where each sub word line is connected to memory cells from among the multiple memory cells and is supplied with a program voltage at the same time. The program scheduler is configured to adjust a program sequence to perform least significant bit (LSB) program operations on each of the sub word lines, then to perform central significant bit (CSB) program operations on each of the sub word lines, and then to perform most significant bit (MSB) program operations on each of the sub word lines, by selectively enabling the corresponding selection lines, respectively.

The program scheduler may adjust the program sequence such that program directions of the LSB, CSB, and MSB program operations are the same. The selection lines may be sequentially enabled for each of the LSB, CSB, and MSB program operations.

The program scheduler may adjust the program sequence such that a program direction of the LSB data program operation is opposite to a program direction of the CSB data program operation and is the same as a program direction of the MSB program operation. The program scheduler may adjust the program sequence of the multiple sub word lines randomly for each of the LSB, CSB, and MSB program operations.

Another illustrative embodiment provides a method for programming a flash memory device. The flash memory device include memory cells formed in a direction perpendicular to a substrate, a first sub word line connected to first memory cells from among the memory cells and selectable by a first selection line, at least one second sub word line connected to second memory cells from the memory cells and selectable by a second selection line, the second memory cells being formed at the same level as the first memory cells and each of the at least one second sub word line being supplied with a program voltage at the same time as the first sub word line. The method includes performing LSB program operations on the first and second sub word lines by enabling the first and second selection lines, respectively; performing CSB program operations on the first and second sub word lines by enabling the first and second selection lines, respectively; and performing MSB program operations on the first and second sub word lines by enabling the first and second selection lines, respectively.

The CSB program operations may be sequentially performed on the first and second sub word lines after the LSB program operations are sequentially performed on the first and second sub word lines. The MSB program operations may be sequentially performed on the first and second sub word lines after the CSB program operations are sequentially performed on the first and second sub word lines.

The program directions of the LSB, CSB and MSB program operations may in the same direction. Alternatively, the program direction of the LSB program operations may be opposite to a program direction of the CSB program operations. Also, the program direction of the MSB program operations may be the same as the program direction of the LSB program operations.

Performing the LSB program operations may include randomly determining program sequences of the first and second sub word lines. Also, at least one of performing the CSB program operations or the MSB program operations may include randomly determining program sequences of the first and second sub word lines.

BRIEF DESCRIPTION OF THE FIGURES

The above and other objects and features will become apparent from the following description with reference to the following figures, wherein like reference numerals refer to like parts throughout the various figures unless otherwise specified.

DETAILED DESCRIPTION

Figure 1:
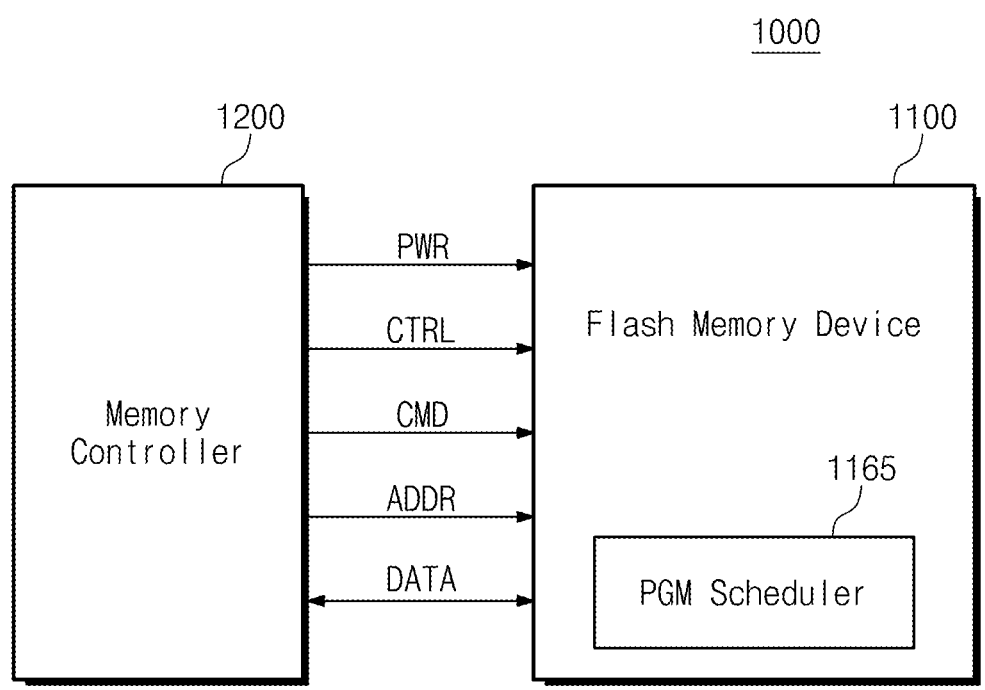
FIG. 1 is a block diagram schematically illustrating a flash memory system, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a flash memory system, according to an embodiment of the inventive concept. Referring to FIG. 1, a flash memory system 1000 includes a flash memory device 1100 and a memory controller 1200. The flash memory system 1000 may include flash memory-based data storage media (not shown), such as a memory card, a USB memory, a Solid State Drive (SSD), and the like.

The flash memory device 1100 may perform erase, write, and read operations under control of the memory controller 1200. For example, the flash memory device 1100 receives a command CMD, an address ADDR, and data DATA via input/output lines. The flash memory device 1100 also receives power PWR via a power line and a control signal CTRL via a control line. The control signal CTRL may include a command latch enable signal CLE, an address latch enable signal ALE, a chip enable signal nCE, a write enable signal new, a read enable signal nRE, and the like.

In the depicted embodiment, the flash memory device 1100 also includes a program scheduler 1165. The program scheduler 1165 is configured to control a program sequence of the flash memory device 1100. For example, the program scheduler 1165 may receive an address ADDR from the memory controller 1200 to determine a page program sequence of the flash memory device 1100. The program scheduler 1165 may be implemented by hardware, software, firmware, or a combination thereof.

In an alternative configuration, the program scheduler 1165 may be included within the memory controller 1200. In this case, the program scheduler 1165 may be managed by a flash translation layer (FTL). The flash memory system 1000 in FIG. 1 may reduce the coupling between memory cells and/or program disturbance caused during program operations.

Figure 2:
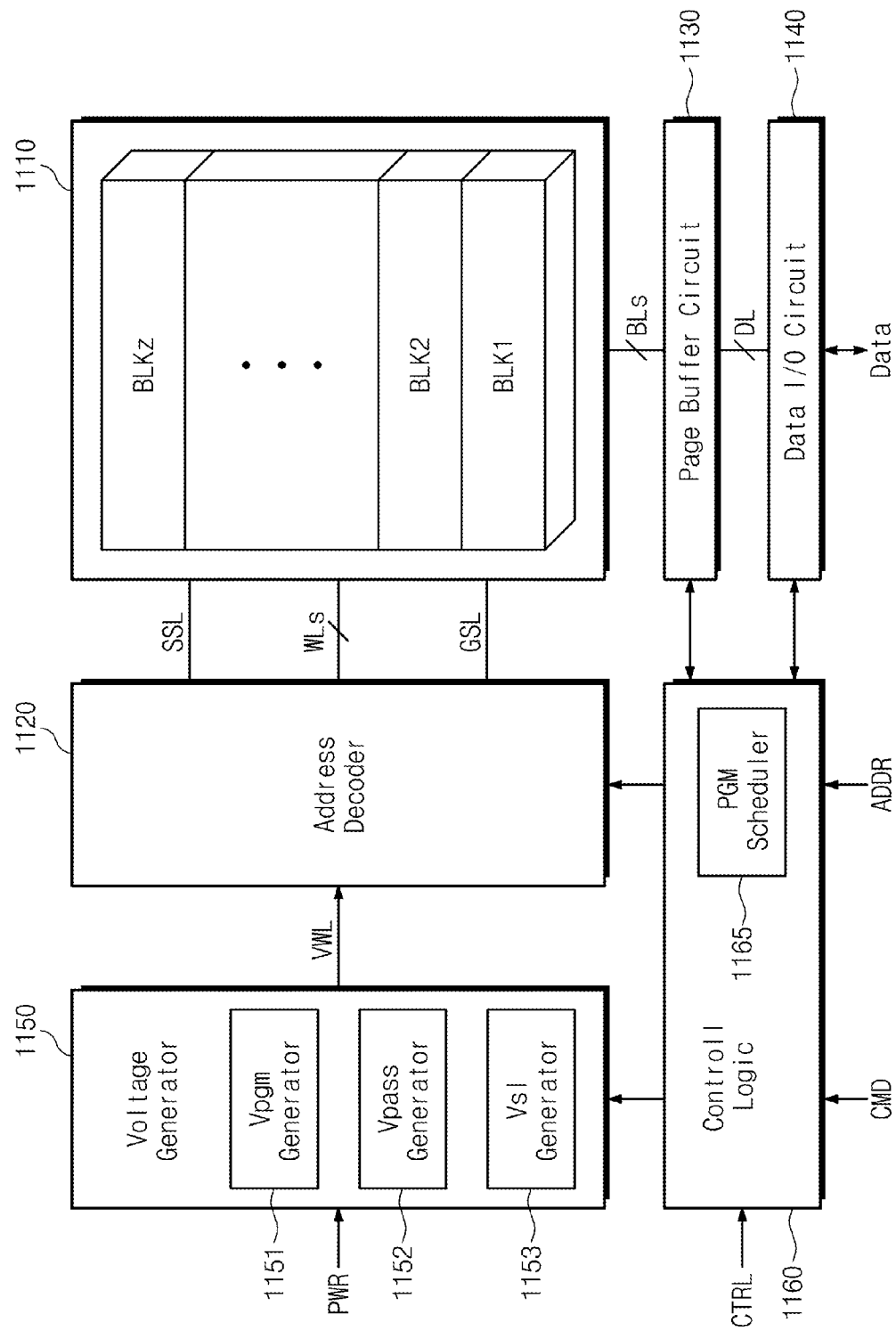
FIG. 2 is a block diagram schematically illustrating a flash memory device in FIG. 1, according to an embodiment of the inventive concept.

FIG. 2 is a block diagram schematically illustrating a flash memory device in FIG. 1, according to an embodiment. Referring to FIG. 2, a flash memory device 1100 includes a memory cell array 1110, an address decoder 1120, a page buffer circuit 1130, a data input/output circuit 1140, a voltage generator 1150, and control logic 1160. The control logic 1160 includes a program scheduler 1165, which may determine a page program sequence as described above.

The memory cell array 1110 may include multiple memory blocks BLK1-BLKz, each of which has a three-dimensional (or vertical) structure. Memory cells in a two-dimensional (or planar) memory block may be formed in a direction parallel to a substrate. In comparison, memory cells in a three-dimensional memory block may be formed in a direction perpendicular to a substrate. Each memory block may be an erase unit of the flash memory device 1100.

The address decoder 1120 is connected to the memory cell array 1110 via selection lines SSL and GSL and/or word lines WLs. The address decoder 1120 receives a word line voltage VWL from the voltage generator 1150, and is controlled by the control logic 1160. The address decoder 1120 may select a word line during programming or reading operations, and may provide a program or read voltage to the selected word line, respectively.

The page buffer circuit 1130 is connected to the memory cell array 1110 via bit lines BLs. The page buffer circuit 1130 may include multiple page buffers (not shown). A page buffer may be connected to a bit line, which is referred to as the all bit line structure. Two or more page buffers may be connected to a bit line, which is referred to as the shield bit line structure. The page buffer circuit 1130 is configured to temporarily store data to be programmed at a selected page or data read out from the selected page.

The data input/output circuit 1140 is connected to the page buffer circuit 1130 via data lines DL. Further, the data input/output circuit 1140 may be connected to a memory controller 1200 (e.g., shown in FIG. 1) via input/output lines. The data input/output circuit 1140 receives program data from the memory controller 1200 during reading operations and provides read data to the memory controller 1200 during reading operations.

The voltage generator 1150 is configured to receive power PWR from the memory controller 1200 to generate a word line voltage VWL needed to read or write data. The word line voltage VWL is provided to the address decoder 1120. The voltage generator 1150 may generate a voltage higher than power supply voltage Vcc. The high voltage may be used as a program voltage Vpgm or a pass volage Vpass, for example.

In the embodiment depicted in FIG. 2, the voltage generator 1150 includes a high voltage generator 1151, a pass voltage generator 1152, and a selection line voltage generator 1153. The high voltage generator 1151 generates a program voltage Vpgm to be provided to a selected word line during a program operation. The program voltage Vpgm may be increased according to iterations of program loops, for example. The pass voltage generator 1152 generates a pass voltage Vpass to be provided to selected and unselected word lines during a program operation. The pass voltage Vpass may be constant regardless of iterations of program loops. The selection line voltage generator 1153 generates a selection line voltage Vsl to be provided to a string selection line SSL or a ground selection line GSL.

The control logic 1160 controls operations (e.g., programming, reading, erasing, etc.) of the flash memory device 1100 using the command CMD, the address ADDR, and the control signal CTRL. For example, during programming, the control logic 1160 may control the address decoder 1120 to provide the program voltage Vpgm to a selected word line, and the page buffer circuit 1130 and the data input/output circuit 1140 to provide program data to a selected page.

The control logic 1160 may include a program scheduler 1165. The program scheduler 1165 receives an address ADDR from the memory controller 1200 to select a word line for page programming. The program scheduler 1165 determines a page program sequence of the flash memory device 1100 according to a predetermined program manner, as described below. Alternatively, the program scheduler 1165 may be implemented outside the control logic 1160.

Figure 3:
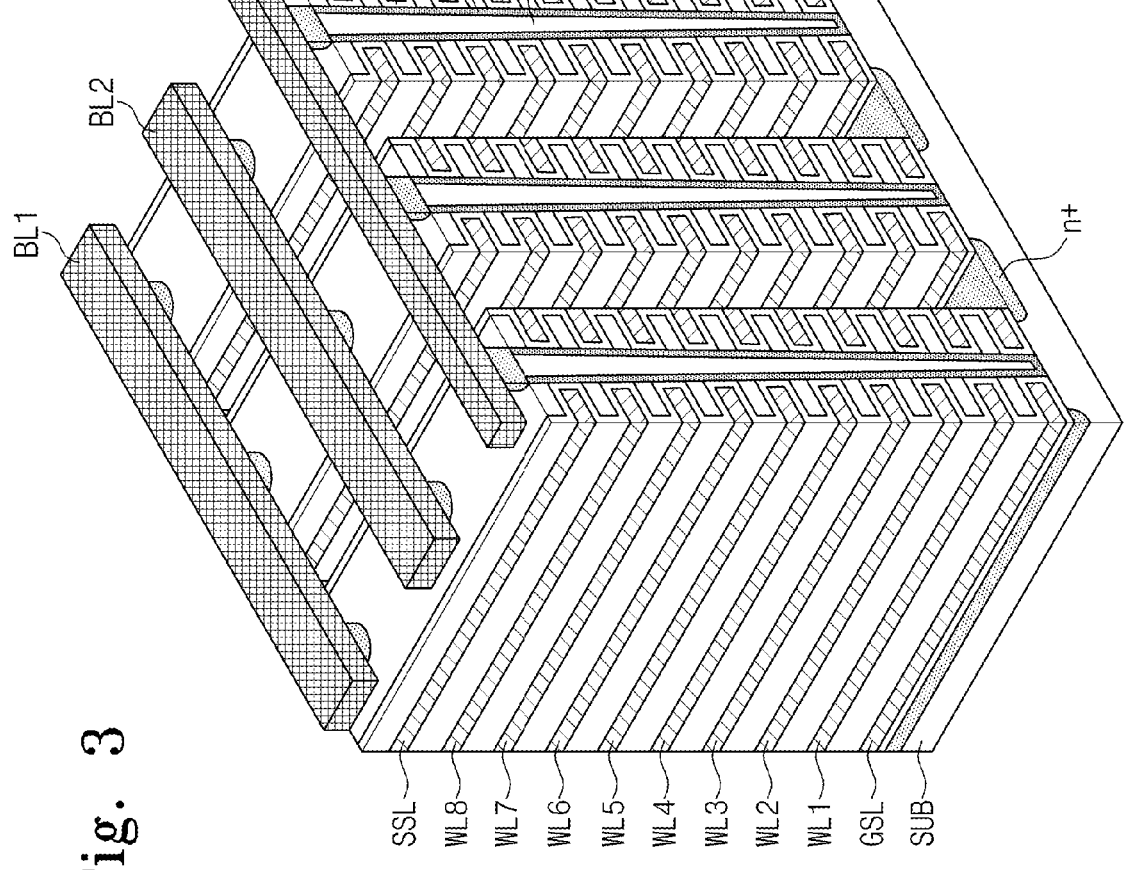
FIG. 3 is a perspective view schematically illustrating a 3D structure of a memory block illustrated in FIG. 2, according to an embodiment of the inventive concept.

FIG. 3 is a perspective view schematically illustrating a 3D structure of a memory block illustrated in FIG. 2, according to an embodiment. Referring to FIG. 3, a memory block BLK1 is formed in a direction perpendicular to a substrate SUB. An n+ doping region is formed at the substrate SUB. A gate electrode layer and an insulation layer are deposited on the substrate SUB in turn. An information storage layer is formed between the gate electrode layer and the insulation layer. The information storage layer may be formed of a tunnel insulation layer, a charge storage layer, and a blocking insulation layer, for example.

When the gate electrode layer and the insulation layer are patterned in a vertical direction, a V-shaped pillar is formed. The pillar penetrates the gate electrode and insulation layers so as to be connected with the substrate SUB. An outer portion of the pillar may be a vertical active pattern, and may be formed of a channel semiconductor. An inner portion of the pillar may be a filing dielectric pattern, and may be formed of an insulation material such as silicon oxide.

The gate electrode layer of the memory block BLK1 is connected with a ground selection line GSL, a plurality of word lines WL1 to WL8, and a string selection line SSL. The pillar of the memory block BLK1 is connected with a plurality of bit lines BL1 to BL3. FIG. 3 illustrates an example in which one memory block BLK1 has two selection lines SSL and GSL, eight word lines WL1 to WL8, and three bit lines BL1 to BL3. However, the inventive concept is not limited to this configuration.

Figure 4:
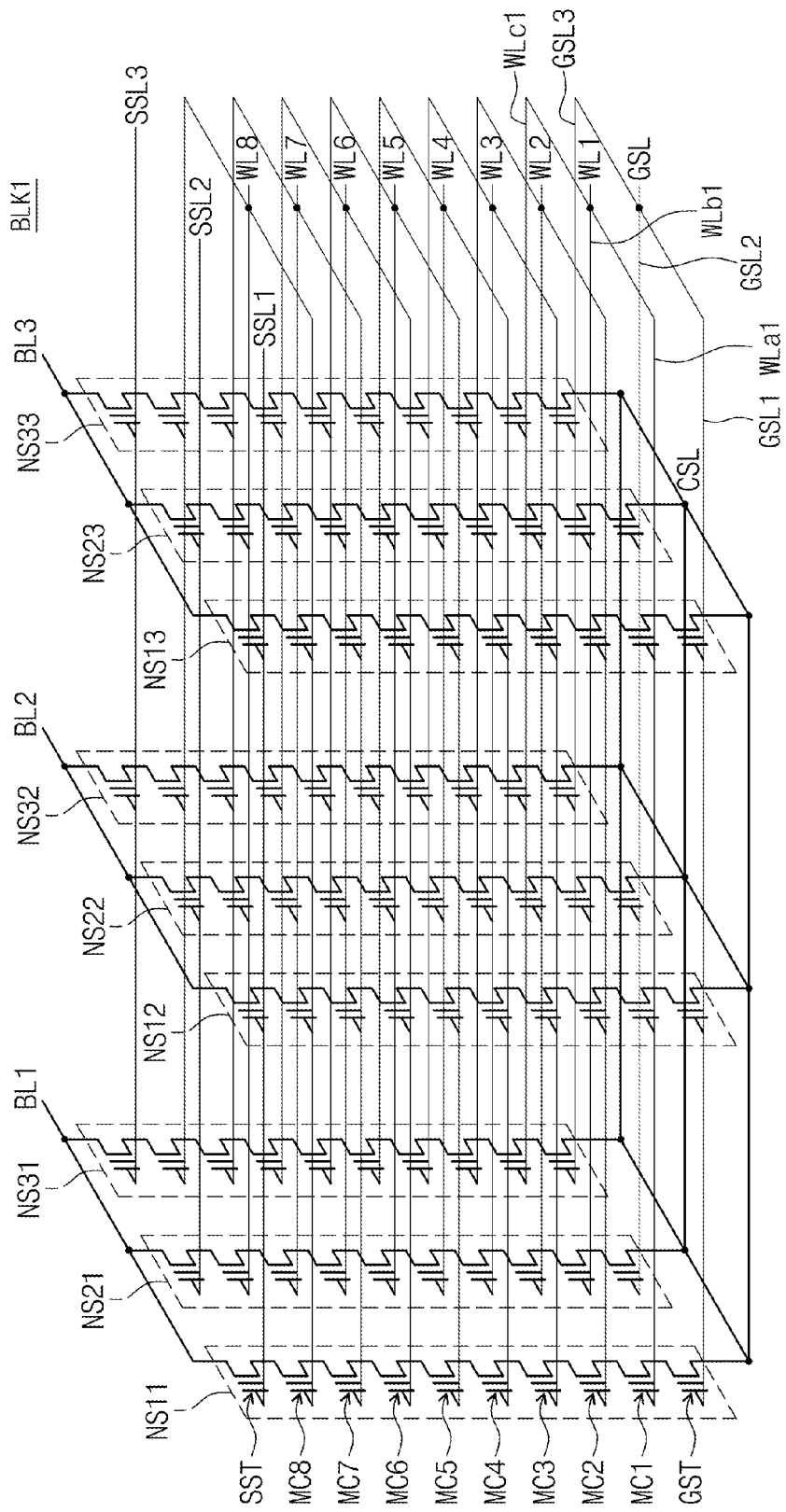
FIG. 4 is a diagram schematically illustrating an equivalent circuit of a memory block illustrated in FIG. 3, according to an embodiment of the inventive concept.

FIG. 4 is a circuit diagram schematically illustrating an equivalent circuit of the memory block BLK1 illustrated in FIG. 3, according to an embodiment. Referring to FIG. 4, representative NAND strings NS11 to NS33 are connected between bit lines BL1 to BL3 and a common source line CSL. Each NAND string (e.g., NS11) includes a string selection transistor SST, a plurality of memory cells MC1 to MC8, and a ground selection transistor GST.

The string selection transistors SST are connected to first, second and third string selection lines SSL1, SSL2 and SSL3. The memory cells MC1 to MC8 are connected to corresponding word lines WL1 to WL8, respectively. The ground selection transistors GST are gated to first, second and third ground selection lines GSL1, GSL2 and GSL3, which are connected to a common ground selection line GSL. At each bit line, a string selection transistor SST is connected to the string selection lines SSL1, SSL2 and SSL3, and a ground selection transistor GST is connected to a common source line CSL.

Word lines (e.g., WL1) located at the same height above the substrate SUB (e.g., located at the same level) within the block BLK1 may be connected in common, and the ground selection lines GSL1 through GSL3 and the string selection lines SSL1 through SSL3 are separated from one another. During a programming operation of memory cells (hereinafter, referred to as a page) connected to the first word line WL1 and included in NAND strings NS11, NS12 and NS13, the first word line WL1, a first string selection line SSL1, and a first ground selection line GSL1 may be selected.

In various configurations, one memory cell can store one bit of data, or two or more bits of data. A memory cell storing one bit of data may be referred to as a single level cell (SLC) or a single bit cell, and a memory cell storing two or more bits of data may be referred to as a multi-level cell (MLC) or a multi bit cell. For example, a 3-bit memory cell may store lower bit data (least significant bit (LSB) data), central bit data (central significant bit (CSB) data), and upper bit data (most significant bit (MSB) data). A 2-bit memory cell may store lower bit data (LSB data) and upper bit data (MSB data).

Figure 5:
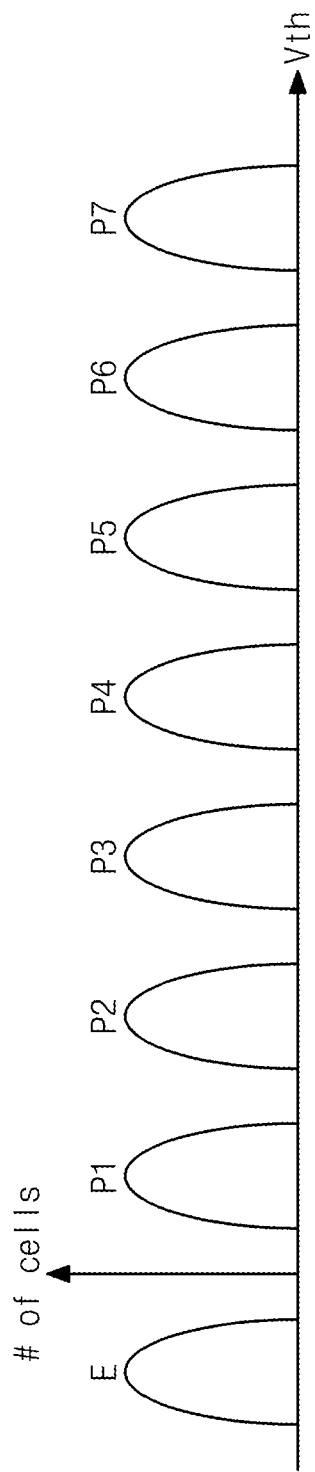
FIG. 5 is a diagram illustrating a threshold voltage variation of a 3-bit MLC memory cell.

FIG. 5 is a diagram illustrating a threshold voltage variation of a 3-bit MLC memory cell. In FIG. 5, the horizontal axis indicates threshold voltage, and the vertical axis indicates the number of memory cells. A 3-bit memory cell may have one of an erase state E and seven program states P1 through P7, according to a threshold voltage distribution.

A flash memory device, such as the flash memory device 1100, may program memory cells, connected to the same word line, at the same time. This program operation may be referred to as a page program operation. In the case of a 3-bit flash memory device, one word line may experience three page program operations. Below, a first page program operation may be referred to as an LSB program operation, a second page program operation may be referred to as a CSB program operation, and a third page program operation may be referred to as an MSB program operation.

Returning to FIG. 4, a word line (e.g., WL1) may be divided into three word lines by selection lines SSL and GSL. For example, a word line WL1 selected by selection lines SSL1, SSL2 and SSL3, may be divided into first, second and third sub word lines WLa1, WLb1 and WLc1. For ease of description, NAND strings NS11, NS12 and NS13 may form a plane PLANEa, NAND strings NS21, NS22 and NS23 may form a plane PLANEb, and NAND strings NS31, NS32 and NS33 may form a plane PLANEc. In this case, the word line WL1 may be divided into first, second and third sub word lines WLa1, WLb1 and WLc1, according to corresponding planes PLANEa, PLANEb and PLANEc, respectively.

Figure 6:
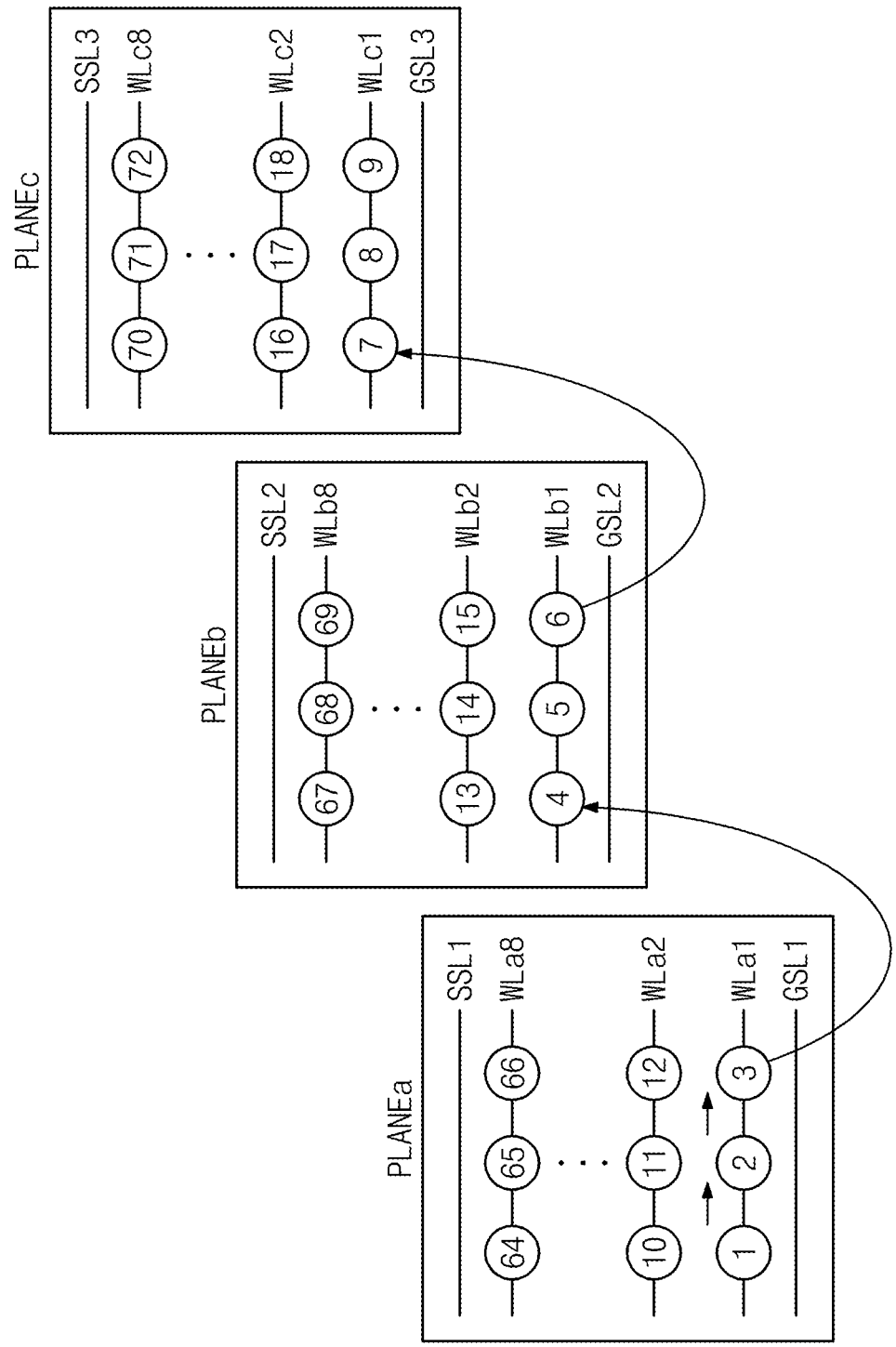
FIG. 6 is a conceptual diagram schematically illustrating an operating method of a program scheduler in FIG. 2.

FIG. 6 is a conceptual diagram schematically illustrating a page program sequence of the program scheduler 1165 in FIG. 2. In FIG. 6, the plane PLANEa includes GSL1, sub word lines WLa1 to WLa8, and SSL1, the plane PLANEb includes GSL2, sub word lines WLb1 to WLb8, and SSL2, and the plane PLANEc includes GSL3, sub word lines WLc1 to WLc8, and SSL3. One or more planes may be provided between the planes PLANEb and PLANEc. Below, it is assumed that three pages LSB, CSB and MSB are programmed at memory cells connected to one sub word line (e.g., WLa1). With this assumption, each memory cell may store 3-bit data.

According to the program method illustrated in FIG. 6, three page program operations (①to ③) are successively performed with respect to the sub word line WLa1 in the plane PLANEa. That is, LSB, CSB and MSB page program operations are successively performed on the sub word line WLa1. Following the page program operations on the sub word line WLa1, three page program operations (④ to ⑥) are successively performed with respect to the sub word line WLb1 in the plane PLANEb. Then, three page program operations (⑦ to ⑨) are successively performed with respect to the sub word line WLc1 in the plane PLANEc. In FIG. 6, the circled numbers 10 to 18 and 64 to 72 denote subsequently executed successive page program operations.

Figure 7:
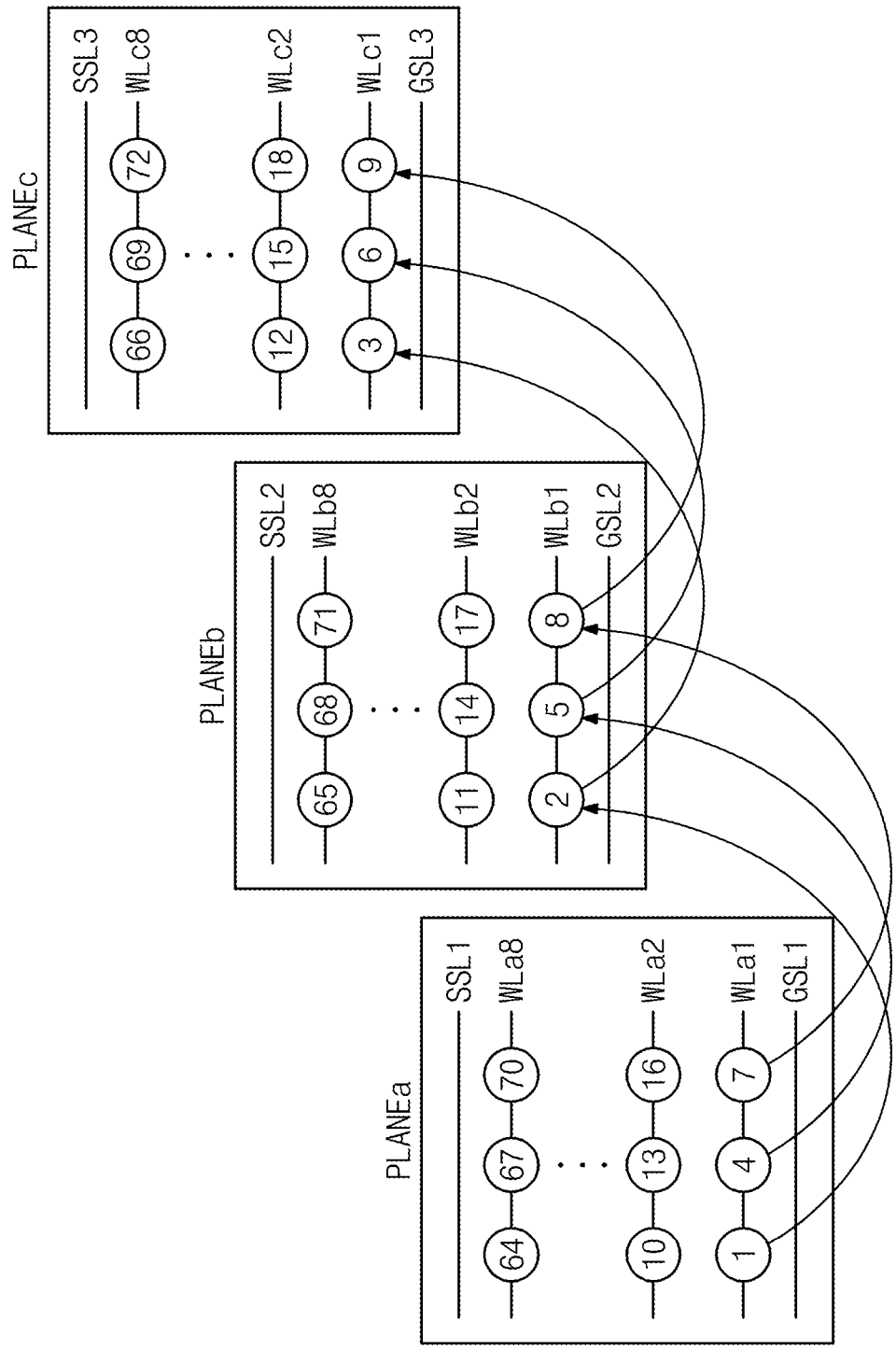
FIG. 7 is a conceptual diagram schematically illustrating a page program sequence of a program scheduler in FIG. 2, according to another embodiment of the inventive concept.

FIG. 7 is a conceptual diagram schematically illustrating a page program sequence of the program scheduler 1165 in FIG. 2, according to an embodiment of the inventive concept. Referring to FIG. 7, an LSB program operation (①) is performed on the sub word line WLa1 in the plane PLANEa. After the LSB program operation (①) is performed, an LSB program operation (②) is performed on the sub word line WLb1 in the plane PLANEb. Then, an LSB program operation (③) is performed on the sub word line WLc1 in the plane PLANEc.

After the LSB program operations on each of the sub word lines WLa1, WLb1 and WLc1 end, then CSB program operations are successively performed. That is, a CSB program operation (④) is performed on the sub word line WLa1 in the plane PLANEa. After the CSB program operation (④) is performed, a CSB program operation (⑤) is performed on the sub word line WLb1 in the plane PLANEb. Then, a CSB program operation (⑥) is performed on the sub word line WLc1 in the plane PLANEc.

After the CSB program operations on the sub word lines WLa1, WLb1 and WLc1 end, then MSB program operations may be performed. That is, an MSB program operation (⑦) is performed on the sub word line WLa1 in the plane PLANEa. After the MSB program operation (⑦) is performed, an MSB program operation (⑧) is performed on the sub word line WLb1 in the plane PLANEb. Then, an MSB program operation (⑨) is performed on the sub word line WLc1 in the plane PLANEc. Page program operations on the remaining word lines WL2 (WLa2~WLc2) to WL8 (WLa8~WLc8) may be performed in the same manner as described above. In FIG. 7, the circled numbers 10 to 18 and 64 to 72 denote subsequently executed successive page program operations.

Figure 8:
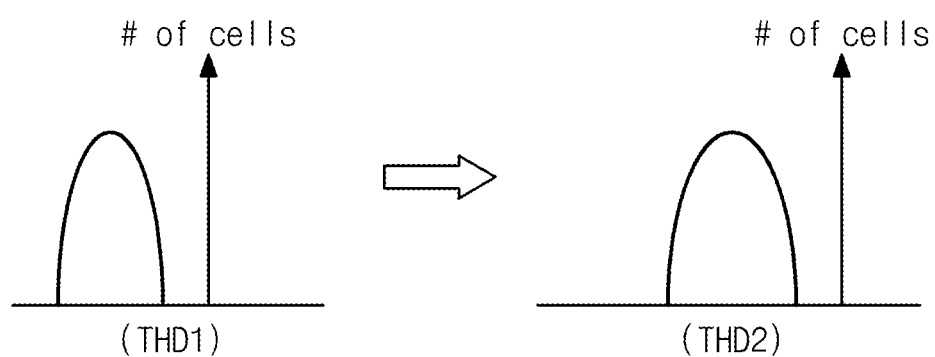
FIG. 8 is a diagram illustrating a threshold voltage variation of memory cells according to a program manner in FIG. 7, according to an embodiment of the inventive concept.

FIG. 8 is a diagram illustrating a threshold voltage variation of memory cells according to the program sequence shown in FIG. 7. In FIG. 8, a THD1 indicates a threshold voltage distribution of erase cells before a page program operation on word line WL1, and THD2 indicates a threshold voltage distribution of erase cells after an LSB program operation on the word line WL1 is performed.

During the programming operation, a program voltage Vpgm is provided to a selected word line (e.g., WL1), and a pass voltage Vpass is applied to unselected word lines (e.g., WL2 to WL8). When memory cells connected to a sub word line WLa1 are programmed, the program voltage Vpgm is provided to memory cells connected to sub word lines WLb1 and WLc1. With the program sequence illustrated in FIG. 6, the program voltage Vpgm is thus provided to memory cells connected to the sub word line WLc1 six times before an LSB program operation is performed on the sub word line WLc1. In comparison, with the program sequence illustrated in FIG. 7, the program voltage Vpgm is provided to memory cells connected to the sub word line WLc1 only twice before the LSB program operation is performed on the sub word line WLc1.

Further, in case of the program sequence illustrated in FIG. 7, the CSB and MSB program operations are performed after the LSB program operations on the sub word lines WLa1 to WLc1 are successively performed. Thus, it is possible to reduce a variation in threshold voltages of memory cells connected to the sub word line WLc1. That is, the error generation probability may be reduced when memory cells connected to the sub word line WLc1 are LSB programmed. The flash memory device 1100 according to an embodiment of the inventive concept may adjust a page program sequence using the program scheduler 1165. Thus, it is possible to reduce generation of errors and to improve the reliability of data.

Figure 9:
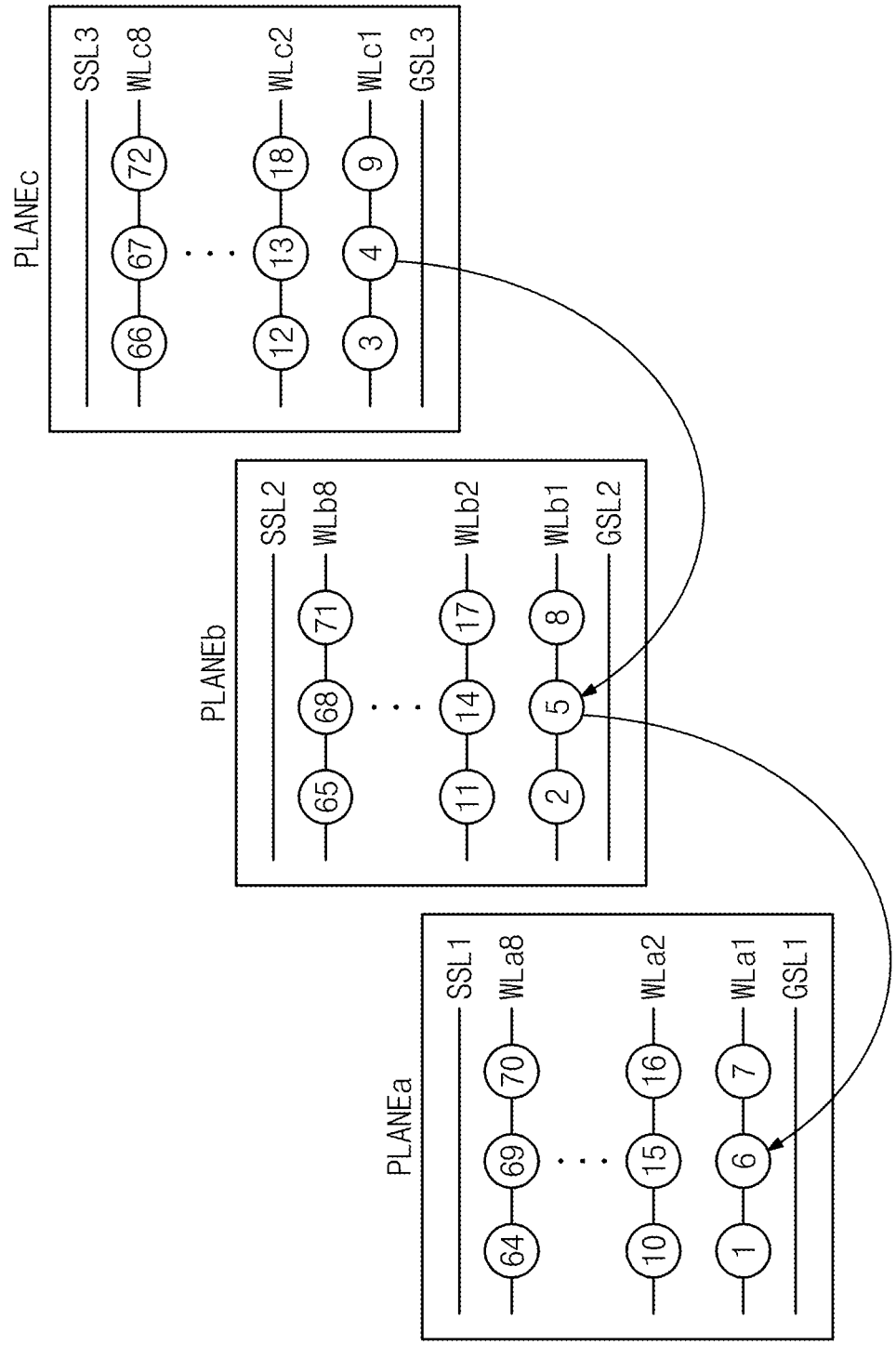
FIG. 9 is a conceptual diagram schematically illustrating a page program sequence of a program scheduler in FIG. 2, according to still another embodiment of the inventive concept.

FIG. 9 is a conceptual diagram schematically illustrating a page program sequence of a program scheduler in FIG. 2, according to still another embodiment of the inventive concept. Referring to FIG. 9, an LSB program operation (①) is performed on the sub word line WLa1 in the plane PLANEa. After the LSB program operation (①) is performed, an LSB program operation (②) is performed on the sub word line WLb1 in the plane PLANEb. Then, an LSB program operation (③) is performed on the sub word line WLc1 in the plane PLANEc.

CSB program operations are carried out after the LSB program operations on the sub word lines WLa1 to WLc1. In the depicted embodiment, a direction of the sequence of the CSB program operations is opposite to a direction of the sequence of the LSB program operations. That is, a CSB program operation (④) is performed on the sub word line WLc1 in the plane PLANEc. After the CSB program operation (④) is performed, a CSB program operation (⑤) is performed on the sub word line WLb1 in the plane PLANEb.

Then, a CSB program operation (⑥) is performed on the sub word line WLa1 in the plane PLANEa.

MSB program operations are carried out after the CSB program operations on the sub word lines WLa1 to WLc1. In the depicted embodiment, a direction of the sequence of MSB program operations is the same as that of LSB program operations, and opposite to that of the CSB program operations. That is, an MSB program operation (⑦) is performed on the sub word line WLa1 in the plane PLANEa. After the MSB program operation (⑦) is performed, an MSB program operation (⑧) is performed on the sub word line WLb1 in the plane PLANEb. Then, an MSB program operation (⑨) is performed on the sub word line WLc1 in the plane PLANEc. Page program operations on the remaining sub word lines WL2 (WLa2~WLc2) to WL8 (WLa8~WLc8) may be carried out in the same manner as described above. In FIG. 9, the circled numbers 10 to 18 and 64 to 72 denote subsequently executed successive page program operations. With the above-described program sequence, since a program voltage Vpgm is applied to the planes PLANEa to PLANEc on average, deterioration of memory cells in the plane PLANEc may be reduced.

Figure 10:
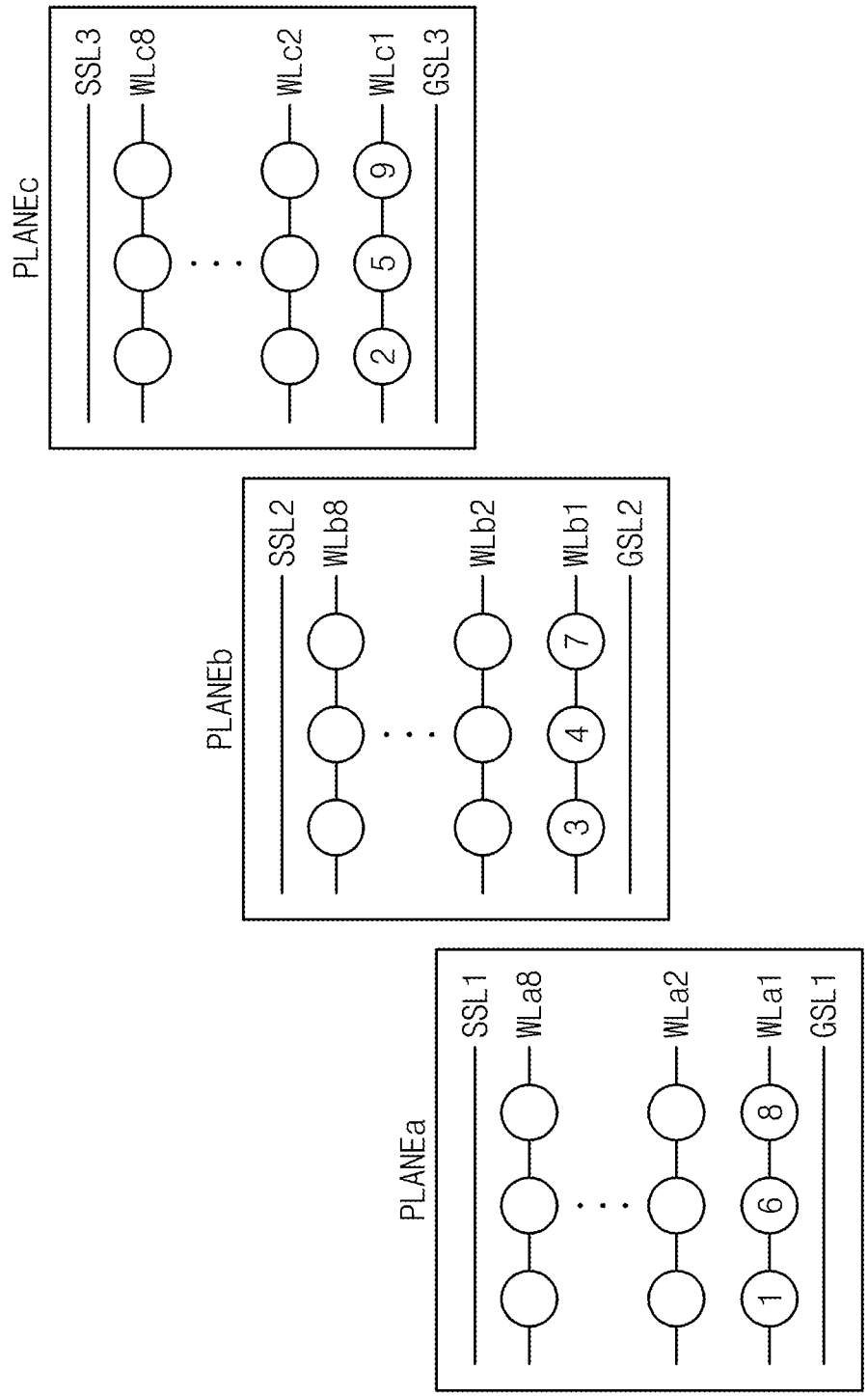
FIG. 10 is a conceptual diagram schematically illustrating a page program sequence of a program scheduler in FIG. 2, according to still another embodiment of the inventive concept.

FIG. 10 is a conceptual diagram schematically illustrating a page program sequence of a program scheduler in FIG. 2, according to still another embodiment of the inventive concept. A program sequence on each word line may be determined randomly. For instance, in the example illustrated in FIG. 10, an LSB program operation (①) is performed on the sub word line WLa1 in the plane PLANEa. After the LSB program operation (①) is performed, an LSB program operation (②) is performed on the sub word line WLc1 in the plane PLANEc. Then, an LSB program operation (③) is performed on the sub word line WLb1 in the plane PLANEb.

CSB program operations are then performed after the LSB program operations on the sub word lines WLa1 to WLc1. Again, the sequence of CSB program operations may be determined randomly. For instance, in the depicted example, a CSB program operation (④) is performed on the sub word line WLb1 in the plane PLANEb. After the CSB program operation (④) is performed, a CSB program operation (⑤) is performed on the sub word line WLc1 in the plane PLANEc. Then, a CSB program operation (⑥) is performed on the sub word line WLa1 in the plane PLANEa.

MSB program operations are then performed after the CSB program operations on the sub word lines WLa1 to WLc1. The sequence of MSB program operations may be determined randomly. For instance, in the depicted example, an MSB program operation (⑦) is performed on the sub word line WLb1 in the plane PLANEb. After the MSB program operation (⑦) is performed, an MSB program operation (⑧) is performed on the sub word line WLa1 in the plane PLANEa. Then, an MSB program operation (⑨) is performed on the sub word line WLc1 in the plane PLANEc. Page program operations on the remaining sub word lines WL2 (WLa2~WLc2) to WL8 (WLa8~WLc8) may be carried out in the same manner as described above.

A flash memory device according to various embodiments of the inventive concept may perform a program operation in sequences different from the above-described manners. For example, a program sequence in FIG. 6 and a program manner in FIG. 7, 9, or 10 may be used together. The program sequence in FIG. 7 may be applied to specific word lines (e.g., WL1 to WL5), and the program sequence in FIG. 9 or 10 may be applied to the remaining word lines (e.g., WL6 to WL8).

The flash memory system 1000 according to an embodiment of the inventive concept may determine a page program sequence via the program scheduler 1165. It is possible to reduce a variation in threshold voltages due to the program disturbance or the coupling between cells by adjusting the page program sequence. As a result, it is possible to reduce the probability of data errors and to improve the reliability of data.

Figure 11:
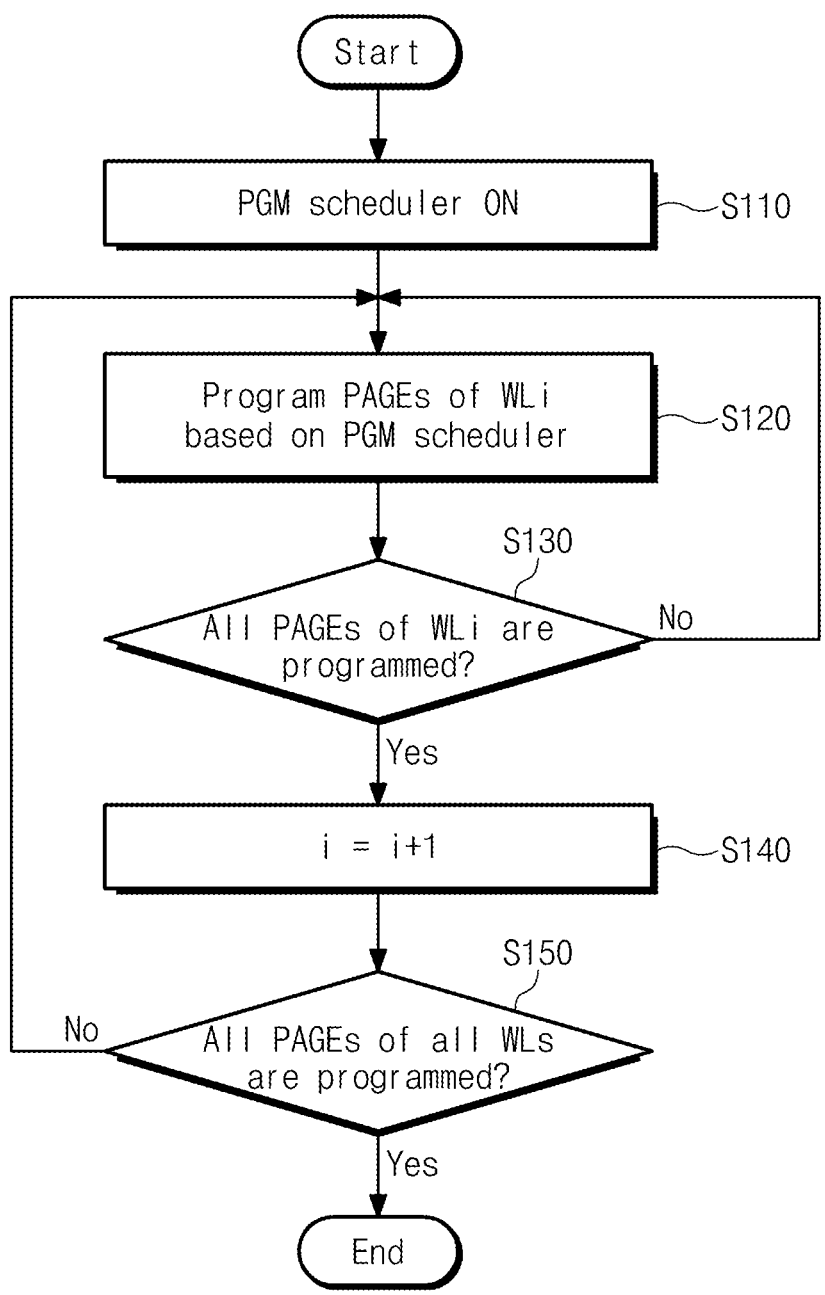
FIG. 11 is a flowchart illustrating a program method of a flash memory device in FIG. 2, according to an embodiment of the inventive concept.

FIG. 11 is a flowchart illustrating a method of programming a flash memory device in FIG. 2, according to an embodiment. As described above, the flash memory device 1100 may determine a page program sequence using the program scheduler 1165.

In operation S110, the program scheduler 1165 is turned on. For example, the program scheduler 1165 may be turned on when the flash memory device 1100 is supplied with power PWR from the memory controller 1200, or may be turned on in response to a program operation. In an embodiment, the program scheduler 1165 may be turned on according a program/erase cycle number. For example, the program scheduler 1165 may be turned on when a program/erase cycle number reaches about 50% of a total program/erase cycle number.

In operation S120, the flash memory device performs page program operations on word line WLi (e.g., i=1) according to the program scheduler 1165. For example, when the program scheduler 1165 performs the program sequence illustrated in FIG. 7, LSB, CSB, and MSB program operations are performed in this order on sub word lines WLa1, WLb1 and WLc1, respectively.

In operation S130, it is determined whether all page program operations have been performed on WLi (e.g., i=1). If not, the method returns to operation S120. If so, the method proceeds to operation S140, in which the number of the word line WLi is incremented by one (e.g., i=2) for performing page program operations on the next word line.

In operation S150, it is determined whether all page program operations on all word lines have been performed. If not, the method returns to operation S120 for performing page program operations on the next word line WLi. If so, the method ends.

Figure 12:
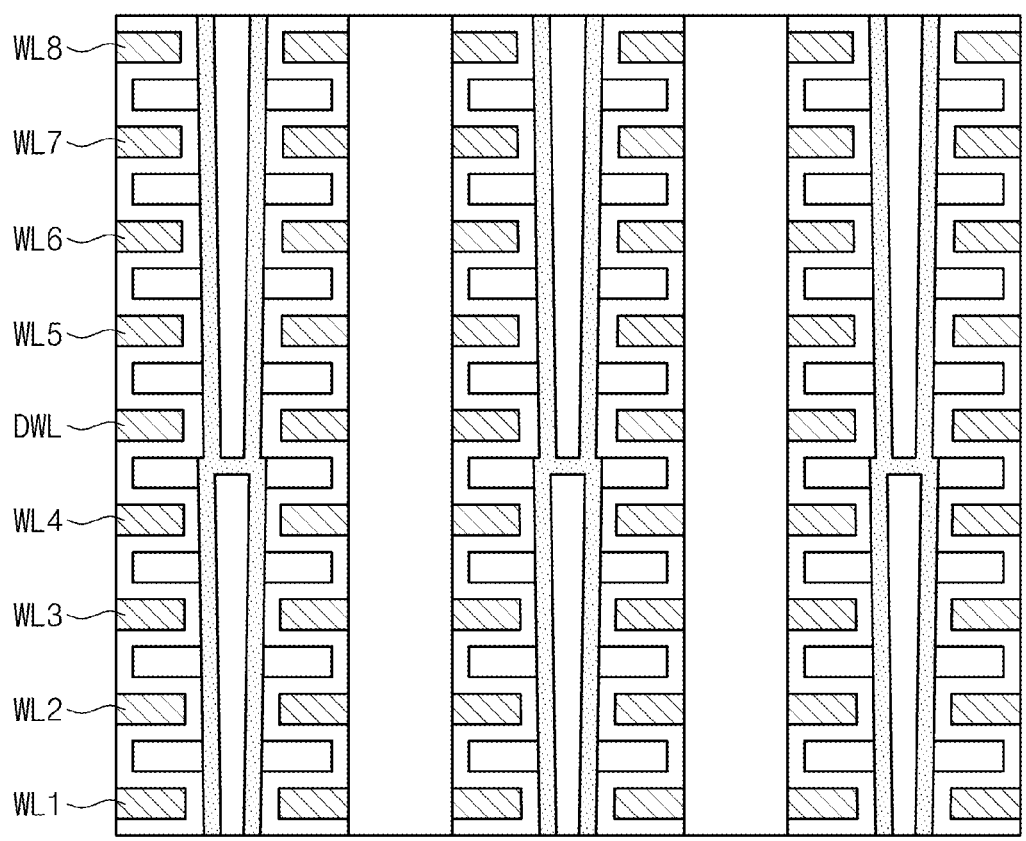
FIG. 12 is a cross-sectional view illustrating a memory cell array, according to another embodiment of the inventive concept.

A flash memory device and a method of programming the same, according to an embodiment of the inventive concept, may be applied to a structure including two or more pillars formed on a substrate, as illustrated in FIG. 12, for example. Referring to FIG. 12, a dummy word line DWL is formed between fourth and fifth word lines WL4 and WL5. Also, embodiments of the inventive concept are applicable to a structure in which a 2D (planar) flash memory is vertically formed.

A memory system according to embodiments of the inventive concept may be incorporated in various products. For example, the memory system according to an embodiment of the inventive concept may be implemented as an electronic device, such as a personal computer, a digital camera, a camcorder, a mobile phone, an MP3 player, a PMP, a PSP, a PDA, and the like and storage devices such as a memory card, an USB memory, a Solid State Drive (SSD), and the like.

Figure 13:
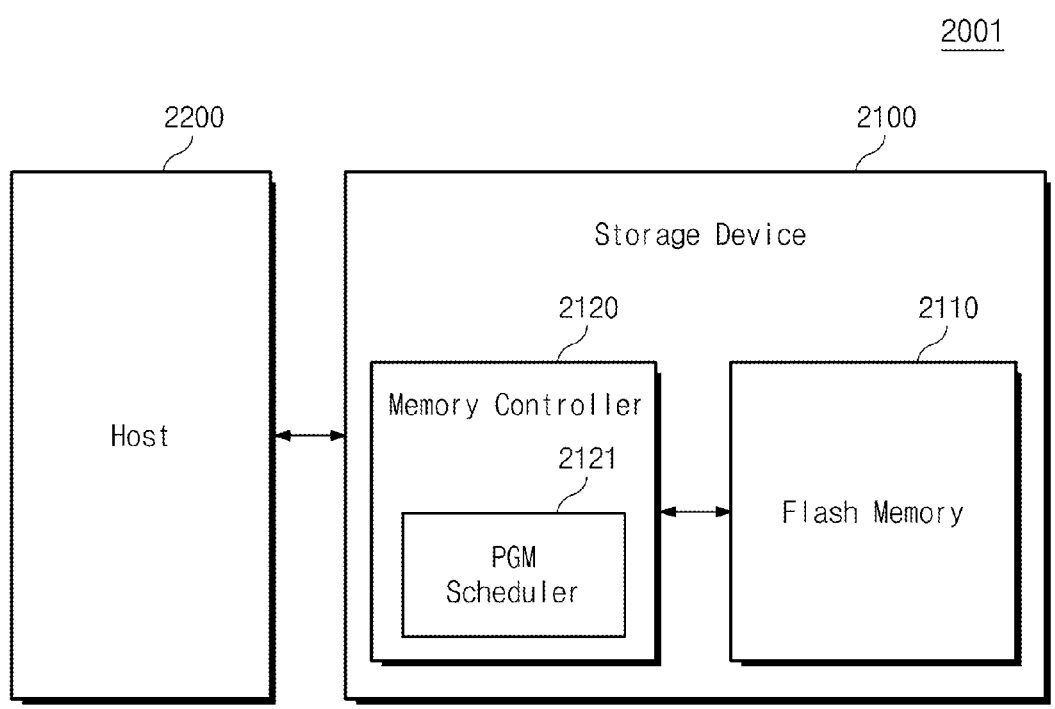
FIG. 13 is a block diagram schematically illustrating an implementation of a memory system, according to an embodiment of the inventive concept.
Figure 14:
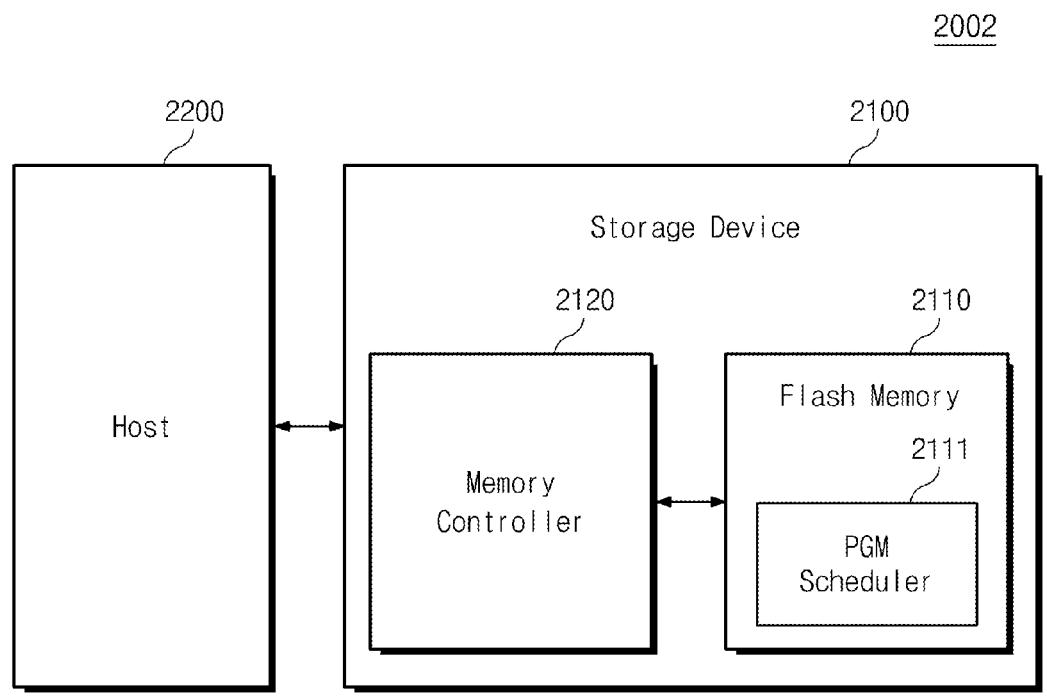
FIG. 14 is a block diagram schematically illustrating another implementation of a memory system, according to an embodiment of the inventive concept.
Figure 15:
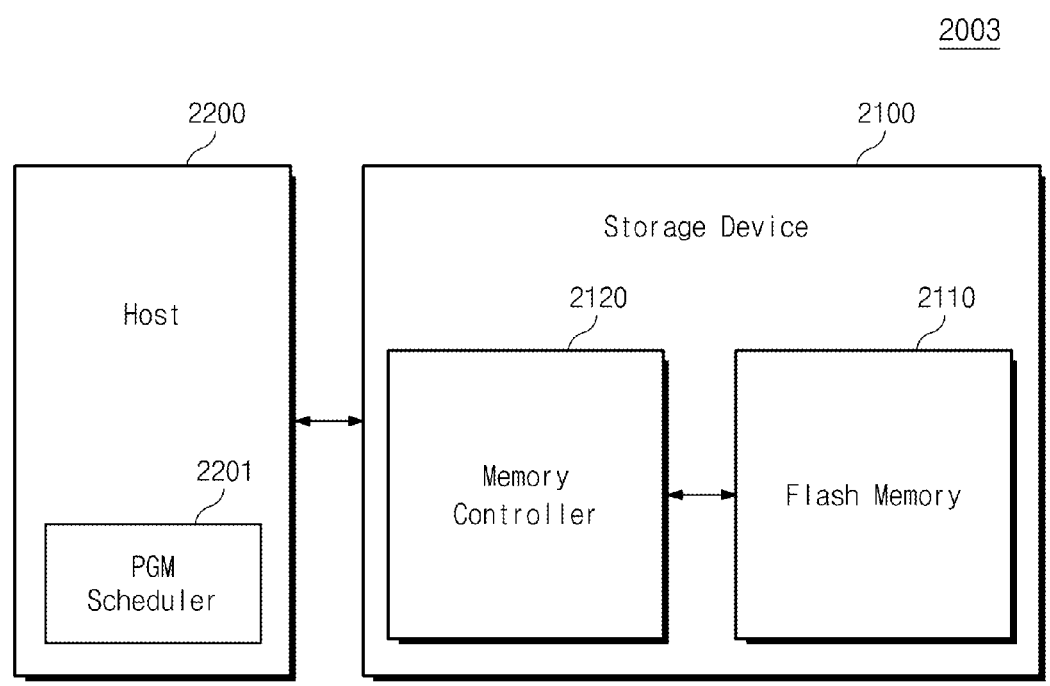
FIG. 15 is a block diagram schematically illustrating another implementation of a memory system, according to an embodiment of the inventive concept.

FIGS. 13 to 15 are block diagrams schematically illustrating various implementations of a memory system, according to embodiments of the inventive concept. Referring to FIGS. 13 to 15, each of the flash memory systems 2001, 2002 and 2003 includes a storage device 2100 and a host 2200. The storage device 2100 includes flash memory 2110 and memory controller 2120.

The storage device 2100 may include a computer readable storage medium, such as a memory card (e.g., SD, MMC, etc.) or an attachable hand-held storage device (e.g., USB memory, etc.). The storage device 2100 is connected to the host 2200. The storage device 2100 may exchange data with the host 2200 via a host interface. Also, the storage device 2100 may be supplied with power from the host 2200 to perform internal operations.

Referring to FIG. 13, a program scheduler 2121 is included within the memory controller 2120. Referring to FIG. 14, a program scheduler 2111 is included within the flash memory 2110. Referring to FIG. 15, a program scheduler 2201 is included within the host 2200. Each of the program schedulers 2121, 2111 and 2201 is configured according to embodiments of the inventive concept, discussed above. The memory systems 2001 to 2003 may reduce the error generation probability during program operations and improve the reliability of data, using the corresponding program schedulers.

Figure 16:
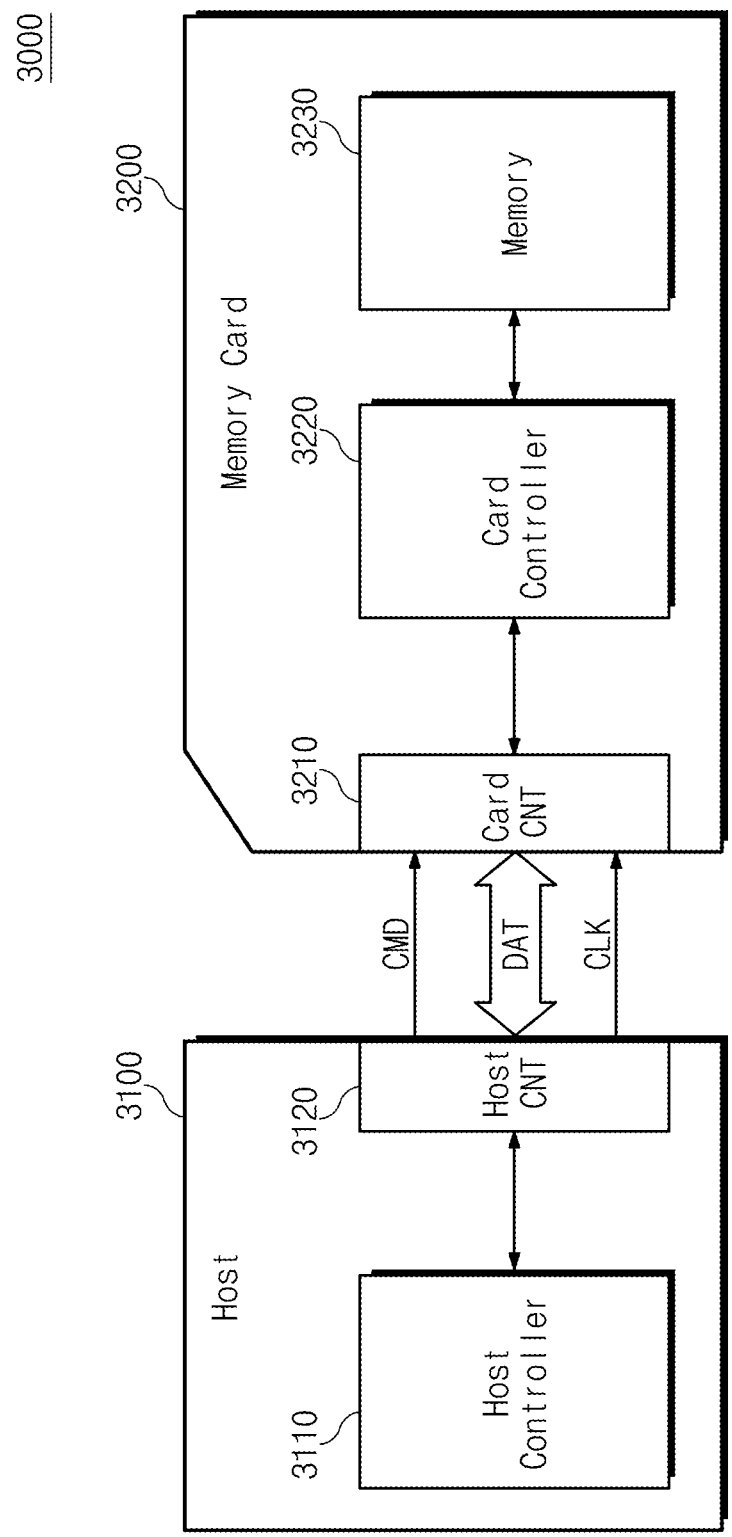
FIG. 16 is a block diagram schematically illustrating a memory card including a flash memory system, according to an embodiment of the inventive concept.

FIG. 16 is a block diagram schematically illustrating a memory card including a flash memory system, according to an embodiment of the inventive concept. Memory card system 3000 includes a host 3100 and a memory card 3200. The host 3100 includes a host controller 3110 and a host connection unit 3120. The memory card 3200 includes a card connection unit 3210, a card controller 3220, and flash memory 3200. Herein, the host controller 3110, the card controller 3220, or the flash memory 3230 may include the program scheduler according to embodiments described herein.

The host 3100 may write data in the memory card 3200 and read data from the memory card 3200. For example, the host controller 3110 may send a command CMD (e.g., a write command), a clock signal CLK generated from a clock generator (not shown) in the host 3100, and data DAT to the memory card 3200 via the host connection unit 3120.

The card controller 3220 may store data in the flash memory 3230 in response to a command input via the card connection unit 3210. The data may be stored in synchronization with a clock signal generated from a clock generator (not shown) in the card controller 3220. The flash memory 3230 may store data transferred from the host 3100. For example, in a case where the host 3100 is a digital camera, the flash memory 3230 may store image data. The memory card 3200 may reduce the error generation probability during program operations and improve the reliability of data, using a program scheduler according to embodiments described herein.

Figure 17:
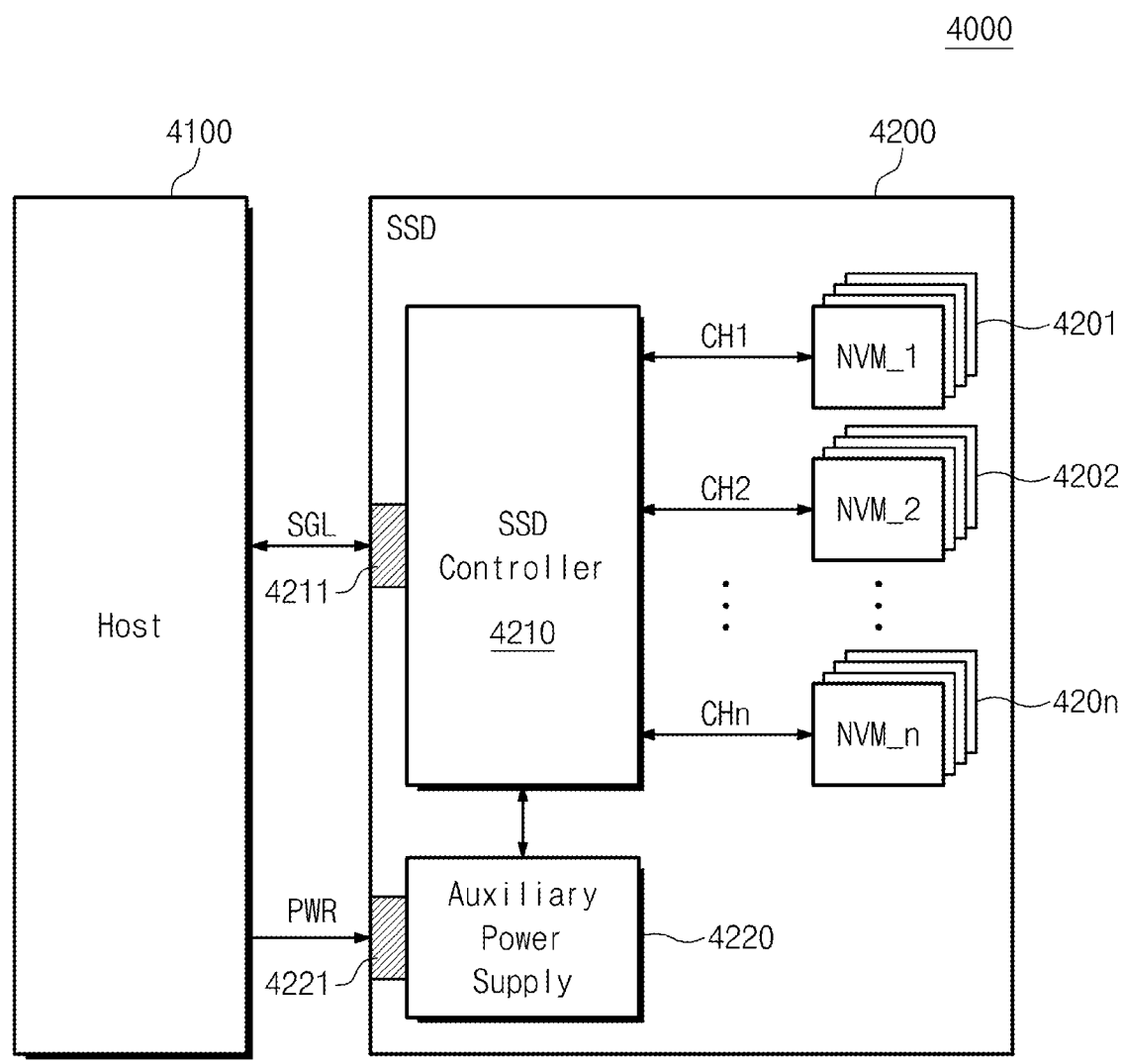
FIG. 17 is a block diagram illustrating a solid state drive system in which a flash memory system is applied, according to an embodiment of the inventive concept.

FIG. 17 is a block diagram illustrating a solid state drive system including a flash memory system, according to an embodiment of the inventive concept. Referring to FIG. 17, a solid state drive (SSD) system 4000 includes a host 4100 and an SSD 4200.

The SSD 4200 exchanges signals SGL with the host 4100 via a signal connector 4211, and is supplied with power PWR via a power connector 4221. The SSD 4200 may include a plurality of nonvolatile memories 4201 to 420n, an SSD controller 4210, and an auxiliary power supply 4220. Herein, the nonvolatile memories 4201 to 420n or the SSD controller may include the above-described program scheduler.

The nonvolatile memories 4201 to 420n may be used as storage media of the SSD 4200. The SSD 4200 may use not only flash memory, but also nonvolatile memories such as PRAM, MRAM, ReRAM, and the like. The nonvolatile memories 4201 to 420n may be connected to the SSD controller 4210 via corresponding channels CH1 to CHn. In various configurations, one channel CH1 to CHn may be connected to one or more of the nonvolatile memories 4201 to 420n. Nonvolatile memories connected to one channel may be connected to the same data bus.

The SSD controller 4210 may exchange signals SGL with the host 4100 via the signal connector 4211. Herein, the signals SGL may include a command, an address, data, and the like. The SSD controller 4210 may be configured to write or read out data to or from a corresponding nonvolatile memory 4201 to 420n according to a command of the host 4100. The SSD controller 4210 will be more fully described with reference to FIG. 18.

The auxiliary power supply 4220 may be connected to the host 4100 via the power connector 4221. The auxiliary power supply 4220 may be charged by the power PWR from the host 4100. The auxiliary power supply 4220 may be placed within the SSD 4200 or outside the SSD 4200. For example, the auxiliary power supply 4220 may be put on a main board to supply an auxiliary power to the SSD 4200.

Figure 18:
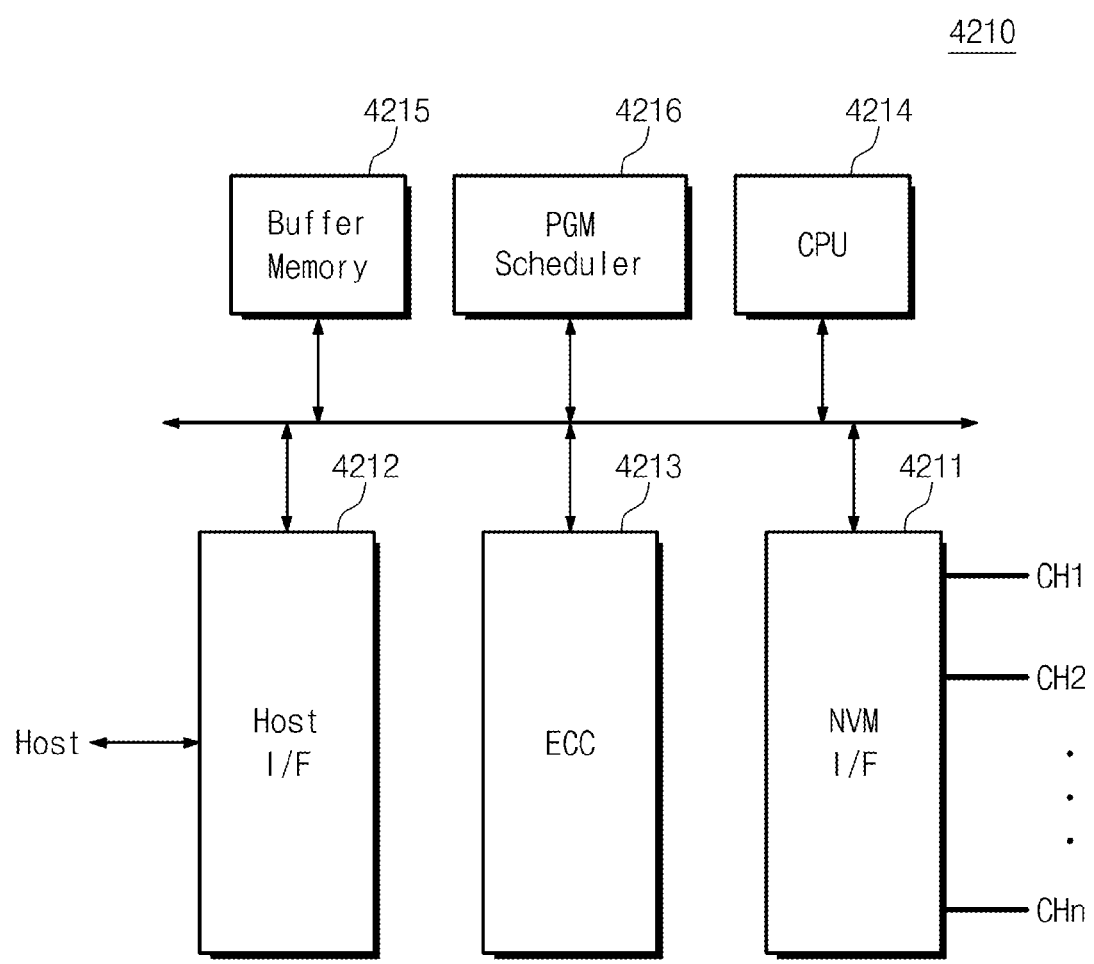
FIG. 18 is a block diagram schematically illustrating an SSD controller in FIG. 17, according to an embodiment of the inventive concept.

FIG. 18 is a block diagram schematically illustrating an SSD controller in FIG. 17, according to an embodiment of the inventive concept. Referring to FIG. 18, the SSD controller 4210 includes an NVM interface 4211, a host interface (I/F) 4212, an ECC circuit 4213, a central processing unit (CPU) 4214, a buffer memory 4215, and a program scheduler 4216.

The NVM interface 4211 may scatter data transferred from the buffer memory 4215 to channels CH1 to CHn, respectively. Also, the NVM interface 4211 may transfer data read from nonvolatile memories 4201 to 420n to the buffer memory 4215. Herein, the NVM interface 4211 may use flash memory interface techniques, for example. That is, the SSD controller 4210 may perform programming, reading, or erasing according to the flash memory interface techniques.

The host interface 4212 may provide an interface with the SSD 4200 according to the protocol of the host 4100. The host interface 4212 may communicate with the host 4100 using Universal Serial Bus (USB), Small Computer System Interface (SCSI), PCI express, ATA, Parallel ATA (PATA), Serial ATA (SATA), Serial Attached SCSI (SAS), and the like. The host interface 4212 may perform a disk emulation function, which enables the host 4100 to recognize the SSD 4200 as a hard disk drive (HDD).

The ECC circuit 4213 may generate ECC using data transferred to the flash memories 4201 to 420n. The ECC thus generated may be stored in a spare area of each of the flash memories 4201 to 420n, for example. The ECC circuit 4213 may detect an error of data read out from the flash memories 4201 to 420n. If a detected error is correctable, the ECC circuit 4213 may correct the detected error.

The CPU 4214 may analyze and process a signal SGL input from the host 4100. The CPU 4214 may control the host 4100 or the flash memories 4201 to 420n via the host interface 4212 or the NVM interface 4211. The CPU 4214 may control operations of the flash memories 4201 to 420n according to firmware for driving the SSD 4200.

The buffer memory 4215 may temporarily store write data provided from the host 4100 or data read out from the flash memory memories 4201 to 420n. The buffer memory 4215 may store metadata to be stored at the flash memories 4201 to 420n or cache data. According to a sudden power-off operation, metadata and/or cache data stored in the buffer memory 4215 may be stored in the flash memories 4201 to 420n. The buffer memory 4215 may include DRAM, SRAM, or the like, for example. The SSD 4200 described with regard to FIGS. 17 and 18 may reduce the error generation probability at a program operation and improve the reliability of data, using the program scheduler 4216.

Figure 19:
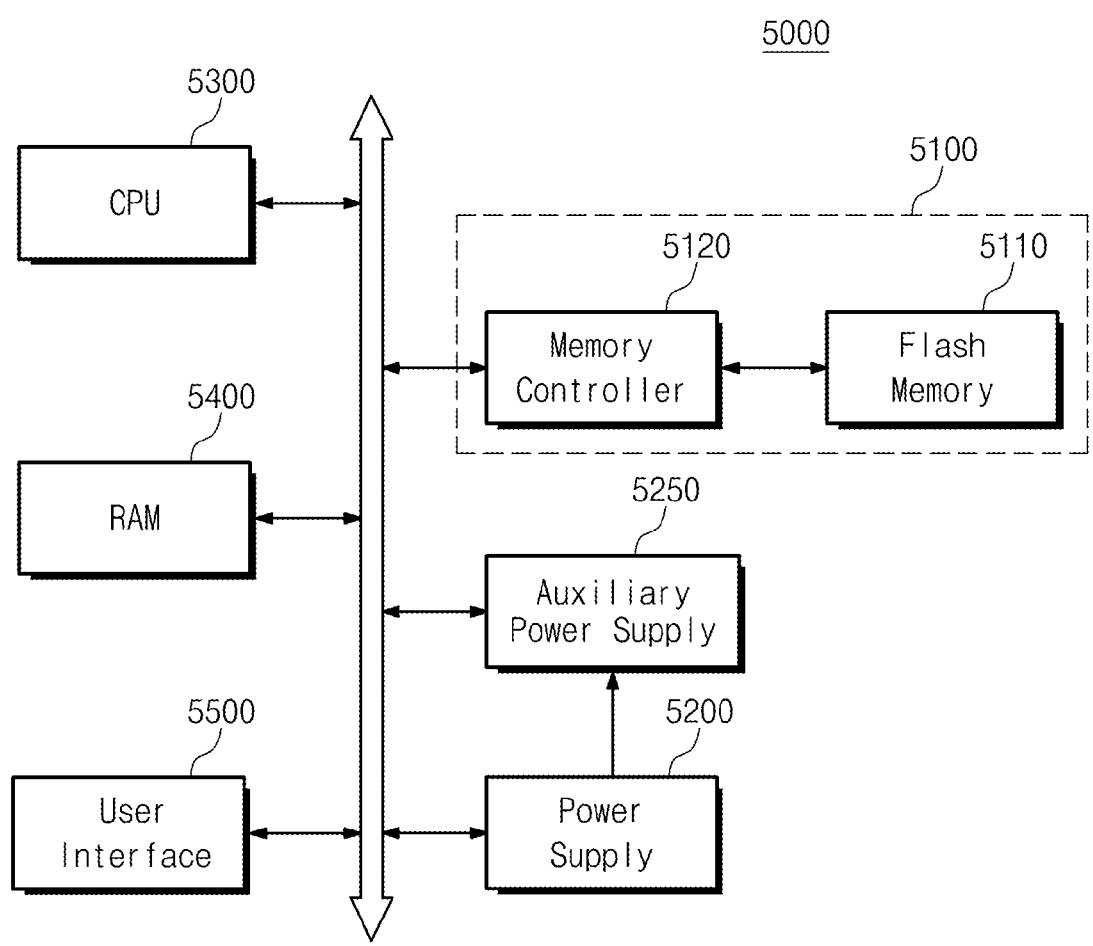
FIG. 19 is a block diagram schematically illustrating an electronic device including a memory system, according to an embodiment of the inventive concept.

FIG. 19 is a block diagram schematically illustrating an electronic device including a memory system, according to an embodiment of the inventive concept. Herein, an electronic device 5000 may be a personal computer or a handheld electronic device, for example, such as a notebook computer, a cellular phone, a PDA, a camera, and the like.

The electronic device 5000 includes a memory system 5100, a power supply device 5200, an auxiliary power supply 5250, a CPU 5300, RAM 5400, and a user interface 5500. The memory system 5100 also includes a flash memory 5110 and a memory controller 5120, according to the various embodiments. The memory system 5100 may reduce the error generation probability during program operations and improve the reliability of data, using a program scheduler, according to the various embodiments.

While the inventive concept has been described with reference to exemplary embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A flash memory device, comprising:
   a plurality of memory cells formed in a direction perpendicular to a substrate;
   a first sub word line connected to first memory cells from among the plurality of memory cells, the first sub word line being formed at a first level and selectable using a first selection line;
   a second sub word line connected to second memory cells from among the plurality of memory cells, the second sub word line being formed at the first level and selectable using a second selection line, wherein the second sub word line is supplied with a program voltage at the same time as the first sub word line; and
   a program scheduler configured to adjust a program sequence to perform lower bit data program operations on the first and second sub word lines and then to perform upper bit data program operations on the first and second sub word lines by enabling the first and second selection lines, respectively.

2. The flash memory device of claim 1, further comprising:
   a third sub word line connected to third memory cells from among the plurality of memory cells, the third sub word line being formed at the first level and selectable using a third selection line, wherein the third sub word line is supplied with the program voltage at the same time as the first sub word line and the second sub word line, and
   wherein the program scheduler is further configured to adjust the program sequence to perform lower bit data program operations on the first to third sub word lines and then to perform upper bit data program operations on the first to third sub word lines by enabling the first, second and third selection lines, respectively.

3. The flash memory device of claim 2, wherein the program scheduler is further configured to sequentially enable the first, second and third selection lines to successively perform the lower bit data program operations on each of the first to third sub word lines, and then to sequentially enable the first, second and third selection lines to successively perform the upper bit data program operations on each of the first to third sub word lines.

4. The flash memory device of claim 2, wherein the program sequence of performing the lower bit data and upper bit data program operations on each of the first to third sub word lines is the same.

5. The flash memory device of claim 2, further comprising:
   a fourth sub word line connected to fourth memory cells from among the plurality of memory cells, the fourth sub word line being formed at a second level, different from the first level, and selectable using the first selection line; and
   a fifth sub word line connected to fifth memory cells from among the plurality of memory cells, the fifth sub word line being formed at the second level and selectable using the second selection line, wherein the fifth sub word line is supplied with the program voltage at the same time as the fourth sub word line,
   wherein the program scheduler is further configured to adjust the program sequence to perform lower bit data program operations on the fourth and fifth sub word lines and then to perform upper bit data program operations on the fourth and fifth sub word lines by enabling the fourth and fifth selection lines, respectively.

6. The flash memory device of claim 5, wherein the program scheduler is further configured to perform the lower bit data and upper bit data program operations on the fourth and fifth sub word lines after performing the lower bit data and upper bit data program operations on the third sub word line.

7. The flash memory device of claim 5, wherein the first and fourth sub word lines are formed in a first plane of a block in the flash memory device, and the second and fifth sub word lines are formed in a second plane of the block in the flash memory device.

8. A flash memory device, comprising:
   a plurality of memory cells formed in a direction perpendicular to a substrate;
   a plurality of sub word lines formed at the same level of the flash memory device and selectable using a corresponding plurality of selection lines, respectively, wherein each sub word line is connected to memory cells from among the plurality of memory cells and is supplied with a program voltage at the same time; and
   a program scheduler configured to adjust a program sequence to perform least significant bit (LSB) program operations on each of the plurality of sub word lines, then to perform central significant bit (CSB) program operations on each of the plurality of sub word lines, and then to perform most significant bit (MSB) program operations on each of the plurality of sub word lines, by selectively enabling the corresponding plurality of selection lines, respectively.

9. The flash memory device of claim 8, wherein the program scheduler adjusts the program sequence such that program directions of the LSB, CSB, and MSB program operations are the same.

10. The flash memory device of claim 9, wherein the plurality of selection lines are sequentially enabled for each of the LSB, CSB, and MSB program operations.

11. The flash memory device of claim 8, wherein the program scheduler adjusts the program sequence such that a program direction of the LSB data program operation is opposite to a program direction of the CSB data program operation and is the same as a program direction of the MSB program operation.

12. The flash memory device of claim 8, wherein the program scheduler adjusts the program sequence of the plurality of sub word lines randomly for each of the LSB, CSB, and MSB program operations.

13. A method of programming a flash memory device comprising a plurality of memory cells formed in a direction perpendicular to a substrate, a first sub word line connected to first memory cells from among the plurality of memory cells and selectable by a first selection line, and at least one second sub word line connected to second memory cells from among the plurality of memory cells and selectable by a second selection line, the second memory cells being formed at the same level as the first memory cells and each of the at least one second sub word line being supplied with a program voltage at the same time as the first sub word line, the method comprising:

performing least significant bit (LSB) program operations on the first and second sub word lines by enabling the first and second selection lines, respectively;

performing central significant bit (CSB) program operations on the first and second sub word lines by enabling the first and second selection lines, respectively; and performing most significant bit (MSB) program operations on the first and second sub word lines by enabling the first and second selection lines, respectively.

14. The method of claim 13, wherein the CSB program operations are sequentially performed on the first and second sub word lines after the LSB program operations are sequentially performed on the first and second sub word lines.

15. The method of claim 14, wherein the MSB program operations are sequentially performed on the first and second sub word lines after the CSB program operations are sequentially performed on the first and second sub word lines.

16. The method of claim 15, wherein program directions of the LSB, CSB and MSB program operations are in the same direction.

17. The method of claim 15, wherein a program direction of the LSB program operations is opposite to a program direction of the CSB program operations.

18. The method of claim 17, wherein a program direction of the MSB program operations is the same as the program direction of the LSB program operations.

19. The method of claim 15, wherein performing the LSB program operations comprises randomly determining program sequences of the first and second sub word lines.

20. The method of claim 19, wherein at least one of performing the CSB program operations or the MSB program operations comprises randomly determining program sequences of the first and second sub word lines.

* * * * *